United States Patent
Maa et al.

(10) Patent No.: US 7,361,574 B1
(45) Date of Patent: Apr. 22, 2008

(54) SINGLE-CRYSTAL SILICON-ON-GLASS FROM FILM TRANSFER

(75) Inventors: Jer-Shen Maa, Vancouver, WA (US); David R. Evans, Beaverton, OR (US); Jong-Jan Lee, Camas, WA (US); Douglas J. Tweet, Camas, WA (US); Sheng Teng Hsu, Camas, WA (US)

(73) Assignee: Sharp Laboratories of America, Inc, Camas, WA (US)

( * ) Notice: Subject to any disclaimer, the term of this patent is extended or adjusted under 35 U.S.C. 154(b) by 0 days.

(21) Appl. No.: 11/601,173

(22) Filed: Nov. 17, 2006

(51) Int. Cl.
*H01L 21/30* (2006.01)
*H01L 21/461* (2006.01)

(52) U.S. Cl. .................. 438/458; 438/752; 438/926; 438/933

(58) Field of Classification Search ............... 438/455, 438/458, 752
See application file for complete search history.

(56) References Cited

U.S. PATENT DOCUMENTS

| | | | |
|---|---|---|---|
| 4,883,561 A | 11/1989 | Gmitter et al. | |
| 5,013,681 A * | 5/1991 | Godbey et al. | 438/459 |
| 5,781,164 A | 7/1998 | Jacobsen et al. | |
| 6,351,010 B1 * | 2/2002 | Yamanaka et al. | 257/350 |
| 6,403,986 B1 | 6/2002 | Fan et al. | |
| 6,607,968 B1 * | 8/2003 | Jurczak et al. | 438/455 |
| 7,187,059 B2 * | 3/2007 | Chan et al. | 257/628 |
| 2001/0036434 A1 * | 11/2001 | Yamoto et al. | 423/328.1 |
| 2004/0092104 A1 * | 5/2004 | Gunn et al. | 438/689 |
| 2005/0255682 A1 * | 11/2005 | Ghyselen et al. | 438/514 |
| 2005/0266653 A1 * | 12/2005 | Moriwaki | 438/406 |
| 2006/0019464 A1 * | 1/2006 | Maa et al. | 438/458 |
| 2006/0073644 A1 * | 4/2006 | Atoji et al. | 438/147 |

OTHER PUBLICATIONS

M. Cai et al, "Single crystal Si layer on glass formed by ion cutting", Journal of Applied Physics, 92, 3388, 2002.
X. Shi et al, "Characterization of low-temperature processed single-crystalline silicon thin-film transistor on glass", IEEE Electron Device Lett, 24, 574, 2003.
S. C. Wang et al, "Device transfer technology by backside etching for poly-Si thin-film transistors on glass/plastic substrate", Jpn. J. Appl. Phys., 42, L1044, 2003.
"Silicon Wafer Bonding Technology for VLSI and MEMS Applications", edited by S.S. Iyer et al, INSPEC, 2002. p. 46.

* cited by examiner

*Primary Examiner*—Mark A. Robinson
*Assistant Examiner*—Kevin Parendo
(74) *Attorney, Agent, or Firm*—Law Office of Gerald Maliszewski; Gerald Maliszewski

(57) ABSTRACT

A method is provided for transferring a single-crystal silicon (Si) film to a glass substrate. The method deposits a germanium (Ge)-containing material overlying a Si wafer, forming a sacrificial Ge-containing film. A single-crystal Si film is formed overlying the sacrificial Ge-containing film. The Si film surface is bonded to a transparent substrate, forming a bonded substrate. The bonded substrate is immersed in a Ge etching solution to remove the sacrificial Ge-containing film, which separates the transparent substrate from the Si wafer. The result is a transparent substrate with an overlying single crystal Si film. Optionally, channels can be formed to distribute the Ge etching solution, and promote the removal of the Ge-containing film.

18 Claims, 7 Drawing Sheets

| Ge - containing film |
|---|
| Si |

FIG. 1

| Si |
|---|
| Ge - containing film |
| Si |

FIG. 2

| Ge - containing film |
|---|
| Si |

FIG. 9

| Si |
|---|
| Ge - containing film |
| Si |

FIG. 10

SINGLE-CRYSTAL SILICON-ON-GLASS FROM FILM TRANSFER

BACKGROUND OF THE INVENTION

1. Field of the Invention

This invention generally relates to integrated circuit (IC) semiconductor processes and, more particularly, to a process for transferring single-crystal silicon thin-films to a glass substrate.

2. Description of the Related Art

The formation of high quality silicon (Si) on transparent substrates continues to be a problem for the IC semiconductor industry. Glass substrates are inexpensive and useful in display applications. However, glass is temperature sensitive and subject to degradation when exposed to temperatures exceeding 600° C. To form high speed or high current capacity thin-film transistors and other active components on a glass substrate, a single-crystal active Si layer would be desirable. However, amorphous thin-film Si can only be converted to a polycrystalline structure. As a compromise, lower process temperature polycrystalline Si thin-films are often used overlying a glass substrate.

An alternate approach is to form the single-crystal Si thin-film in a separate process, and subsequently transfer the Si film to a glass substrate. In one process, strained Si is first formed on a relaxed Silicon/Germanium (SiGe) layer by hydrogen implantation induced relaxation. This film is then transferred to glass by direct wafer bonding and hydrogen induced exfoliation. Although part of the SiGe layer is also transferred to glass, due to the high etch selectivity between SiGe and Si, a very smooth Si layer with thickness less than 50 nanometers (nm) can be easily achieved.

The above-described transfer technique makes it possible to develop future advanced devices on inexpensive glass substrates, and advanced display devices can benefit from an improved silicon quality. However, this process require two hydrogen implantation steps, two chemical mechanical polishing (CMP) steps, several film deposition steps, and several furnace annealing steps. First, a relaxed SiGe layer is formed and CMP process performed, followed by $H_{2+}$ split implantation at 50 keV to 160 keV, with a dose of 2E16 to 6E16/cm². Subsequent splitting is carried out at 300° C. to 450° C. for 2-3 hours. After wafer splitting, it is necessary to remove the top portion of the Si layer and part of SiGe layer by a dry etch step. Another post dry etch anneal is carried out at 400° C. to 650° C. A fine touch CMP is carried out to remove the roughness resulting from the splitting, followed by a selective etch step to remove the SiGe layer.

Even earlier efforts in transferring Si to glass substrate are the so-called "ion cutting" techniques are disclosed by Cai et al. and Shi et al. These processes implant H ions at 50 keV, with doses ranging from 4E16 to 1E17/cm2, for layer splitting after wafer bonding. However, the process is not suitable for low-cost applications. Wang discloses a device transfer method by backside etching to transfer poly-Si TFTs from Si wafers to glass or plastic substrates. However, single-crystal Si would be preferred.

Gmitter et al. disclose a "lift-off" technique to remove an epitaxial film from a single crystal substrate, which is grown and adhered to a second substrate, by selectively etching away a thin release layer positioned between the epitaxial film and the substrate. In practice, the difficulty in this process is the formation and entrapment of gas, formed as a reaction product of the etch process, within the etched channels. The gas bubbles in the channel prevent or diminish further etching, and cause cracking in the epitaxial film. The process can be modified to cause the edges of the film to curve upwardly as the release layer is etched away, thereby providing means for the escape and out-diffusion of the etch reaction products in the area between the film and the substrate. However, control over forming the curved film edges can be problematic.

Jacobsen et al. and Fan et al. disclose a lift-off technique for use with matrix display systems and light emitting diode displays. Fan et al. disclose a technique of coating materials having different coefficients of expansion onto the epitaxial film layers. The entire structure is brought to a suitable temperature to generate thermal stress between the coating compositions, while the structure is subjected to a release etchant. This stress results in the lift-off of individual thin-film areas supported by the coating.

It would be advantageous if single-crystal Si could be formed on glass using a simplified transfer process.

SUMMARY OF THE INVENTION

A present invention is a method is for transferring single-crystal Si film onto glass using a wafer separation process that dissolves a sacrificial layer. The use of this sacrificial layer eliminates the need for hydrogen implantation, which simplifies the process steps. Since a furnace annealing step is no longer needed in the wafer separation process, the possibility of forming bubbles, blisters, or film peeling from stress relief during the thermal cycles is eliminated. As added protection, an etching solution can be used that does not consist of gas generating chemicals, to prevent the creation of gas bubbles in the etch channels. Also, a liquid pump can be attached to the edge of the bonded wafers to pump the etching solution from one end of the wafer edge to the other end of the wafer edge, to ensure the proper circulation of etch solution and uniform removal of the sacrificial layer.

Accordingly, a method is provided for transferring a single-crystal silicon (Si) film to a glass substrate. The method deposits a germanium (Ge)-containing material overlying a Si wafer, forming a sacrificial Ge-containing film. A single-crystal Si film is formed overlying the sacrificial Ge-containing film and exposed to dilute SC-1, forming a hydrophilic Si film surface. The hydrophilic Si film surface is bonded to a transparent substrate, forming a bonded substrate. The bonded substrate is immersed in a Ge etching solution to remove the sacrificial Ge-containing film, which separates the transparent substrate from the Si wafer. The result is a transparent substrate with an overlying single crystal Si film.

In one aspect, the single-crystal Si film and underlying sacrificial Ge-containing film are etched prior to exposing the single-crystal Si film to dilute SC-1, forming solution channels between Si film regions having sidewalls. Then, when the bonded substrate is immersed in the Ge etching solution, and the Ge etching solution is induced into the solution channels. In another aspect, the Ge etching solution is pressure-induced into the solution channels. The Ge etching solution may be a solution such as persulfate, periodate, perbromate, perchlorate, organic peroxide, inorganic peroxide, or oxidizing agents. The sacrificial Ge-containing film may be a strained SiGe film layer, or a strained SiGe layer with an overlying relaxed SiGe layer for example.

Additional details of the above-described method are provided below.

BRIEF DESCRIPTION OF THE DRAWINGS

FIGS. 1 through 8 depict steps in the process of forming a single-crystal Si film on a glass substrate using an exemplary variation of the present invention fabrication process.

FIGS. 9 through 12 depict steps in a second variation of the process of forming a single-crystal film on a glass substrate.

DETAILED DESCRIPTION

Single-crystal Si can be transferred to glass, or any other temperature-sensitive substrate, using a process that separates a Si wafer by dissolving a sacrificial layer Ge-containing layer. The process eliminates the hydrogen implantation and furnace annealing steps used in conventional transfer processes. The elimination of the furnace anneal minimizes the formation of bubbles, blisters, or film peeling due to the stress of thermal cycling.

A liquid pump can also be attached to the edge of the bonded wafers to pump an etching solution from one end of the wafer edge to the other end of the wafer edge, to ensure the proper circulation of etch solution and uniform removal of the sacrificial layer. Common etch chemicals may be used to enable the dissolution of the sacrificial layer. However, other chemicals such as persulfate or periodate are desirable since they do not generate bubbles during reactions. Other etchants of interest include perbromate, perclorate, organic and inorganic peroxides, and other suitable oxidizing agents.

As an example, although the etching of Ge in peroxide solution does not form gaseous reaction products directly, oxygen can be formed from decomposition of peroxide as follows:

$$4e^- + 4H^+ + 2H_2O_2 \rightarrow 4H_2O$$

$$2H_2O + Ge \rightarrow GeO_2 + 4H^+ + 4e^-.$$

Therefore, the overall reaction can be expressed as follows:

$$Ge + 2H_2O_2 \rightarrow GeO_2 + 2H_2O.$$

Although the above equation does not show gaseous products, oxygen can be generated by the following disproportionation reaction of peroxide:

$$2H_2O_2 \rightarrow 2H_2O + O_2.$$

However, in the case of persulfate, there is no reaction to form gaseous products:

$$2e^- + S_2O_8^{2-} \rightarrow 2SO_4^{2-}$$

$$2S_2O_8^{2-} + 2H_2O + Ge \rightarrow GeO_2 + 4H^+ + 4SO_4^{2-}$$

FIGS. 1 through 8 depict steps in the process of forming a single-crystal Si film on a glass substrate using an exemplary variation of the present invention fabrication process. In FIG. 1, SiGe or Ge is deposited on a Si wafer by chemical vapor deposition (CVD). It is known that beyond a critical thickness, there is a partial relaxation of the film. This Ge-containing layer serves as sacrificial layer. If a thicker film is used, so that the film surface becomes rough, a chemical mechanical polish (CMP) process can be used to polish the surface. It is also known that the partial relaxation of the film may affect surface roughness, causing the formation of threading dislocation. However, the crystalline quality of the single-crystal Si film is still better than the large or long grain polycrystalline Si films form by the laser annealing.

In FIG. 2 a single-crystal Si film is deposited on the sacrificial layer.

Figure 3:
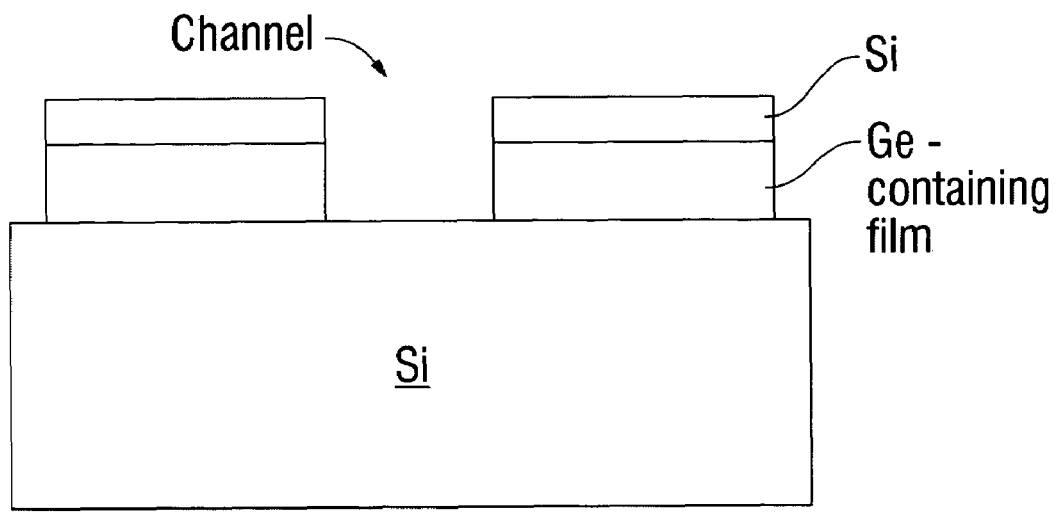

In FIG. 3 the single-crystal Si film and underlying sacrificial film are optionally patterned and etched. This etching forms channels (solution channels), so that etch solution penetrates the entire wafer area.

Figure 4:
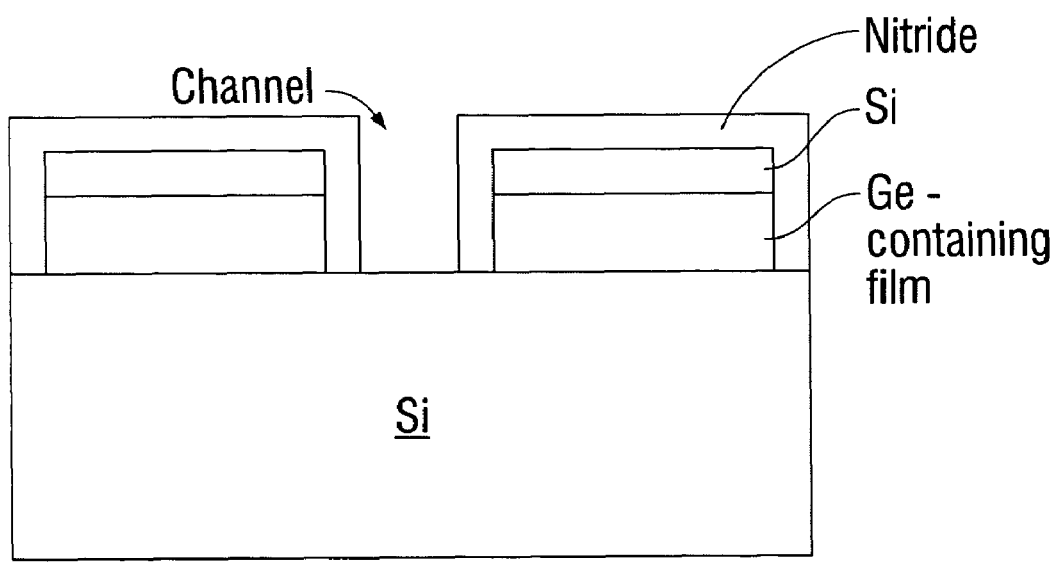

In FIG. 4 a thin layer of plasma-enhanced CVD (PECVD) nitride is optionally deposited. The nitride protects the sacrificial layer from surface treatment solutions, such as dilute SC-1 solution (see FIG. 5), before wafer bonding.

Figure 5:
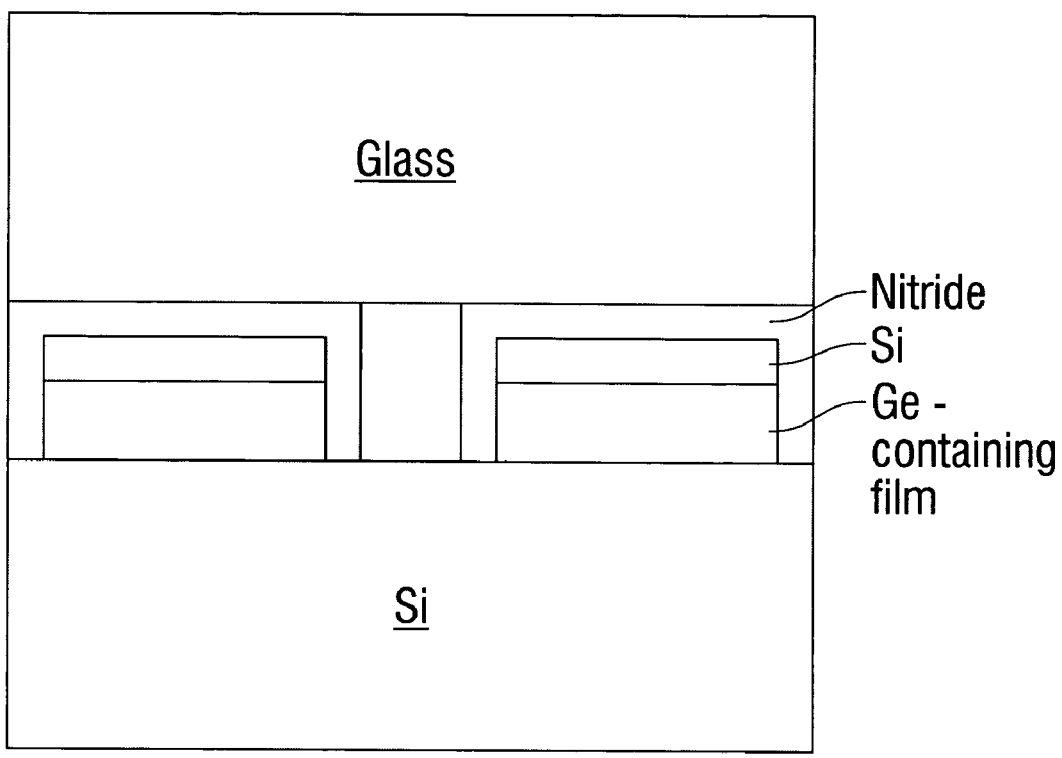

In FIG. 5 the wafer of FIG. 4 is bonded to glass, after proper surface treatment (e.g., dilute SC-1 solution), to make the surface hydrophilic. Since the sidewall of the sacrificial layer can be unintentionally etched during the surface treatment, the control of the solution concentration and etch time is important.

Figure 6:
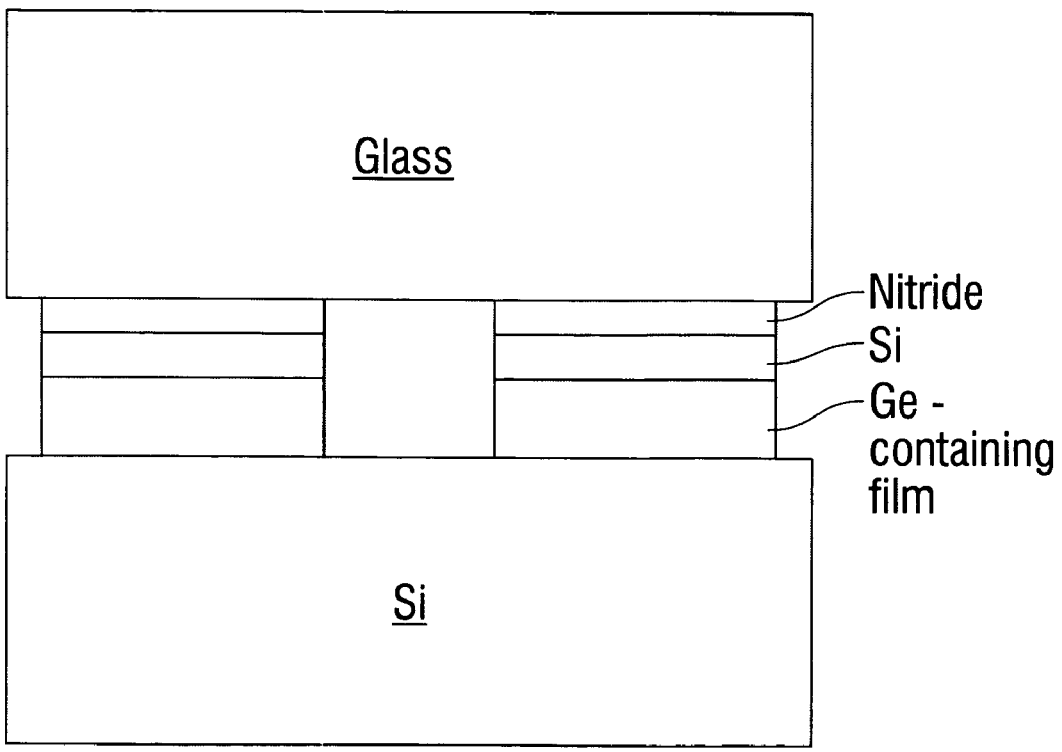

In FIG. 6, the bonded wafer is optionally immersed in hot phosphoric solution, to remove the thin nitride formed on the feature sidewalls. This reaction does not generate gaseous reaction products. As an option, a liquid pump can be attached to a wafer adaptor, which is then connected to one side of the bonded wafers. This liquid pump helps the solution to flow through the narrow channels between the single-crystal Si and glass wafers. A subsequent cycle in water is needed to remove the residual phosphoric solution.

Figure 7:
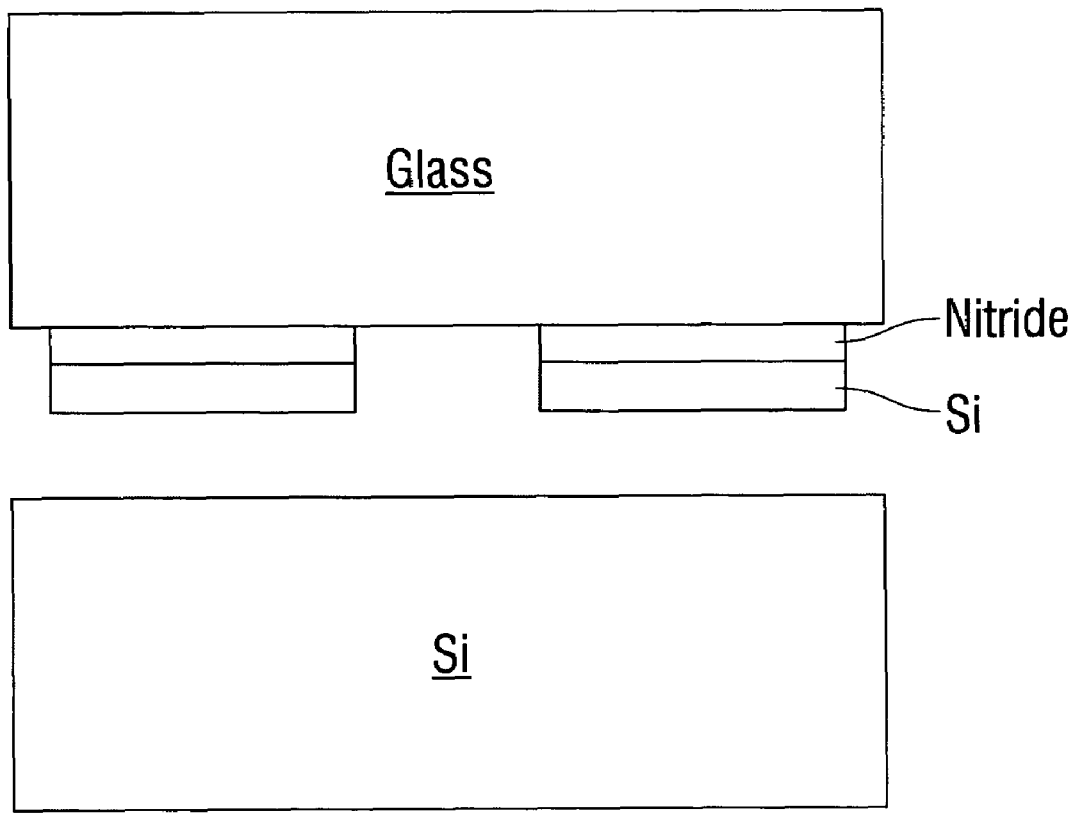

In FIG. 7 the bonded wafer (wafer couples) is immersed in etching solution, which removes the SiGe or Ge at high rate. Again, a liquid pump can be attached to the side of wafer to accelerate the liquid flow through the channels.

Figure 8:
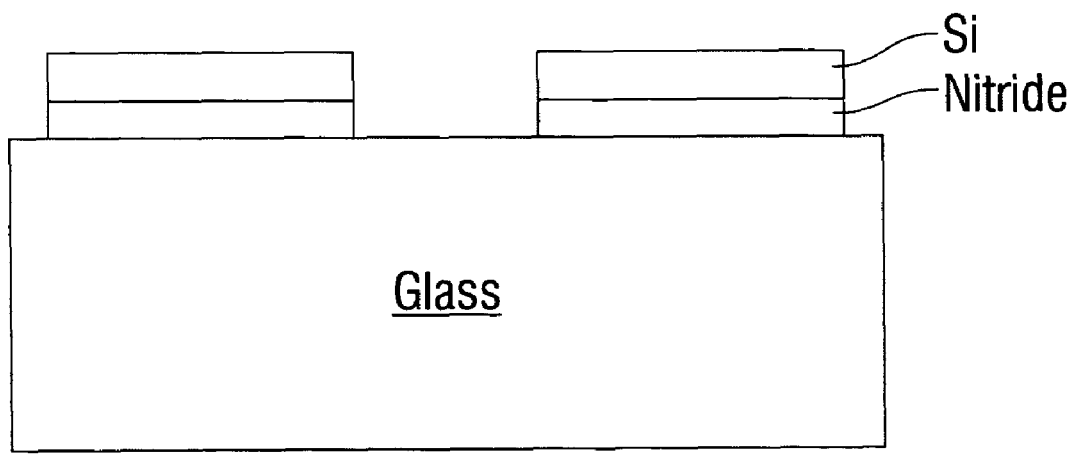

After the sacrificial layer is completely etched, FIG. 8 depicts the separation of the wafers.

FIGS. 9 through 12 depict steps in a second variation of the process of forming a single-crystal film on a glass substrate. In FIG. 9 a Ge-containing film is deposited on a Si wafer. A portion of the Ge-containing film may be relaxed. Optionally, the surface may be smoothed using a CMP process.

In FIG. 10 a single-crystal Si film is formed on the sacrificial layer.

Figure 11:
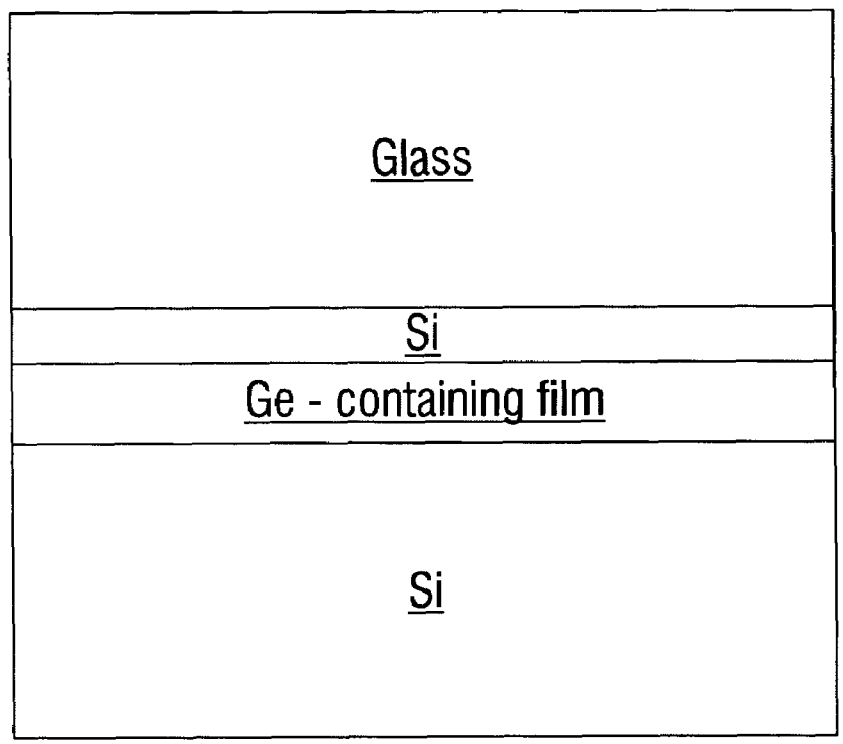

In FIG. 11 a glass substrate is bonded to the Si film, after proper surface treatment to make the surface hydrophilic.

Figure 12:
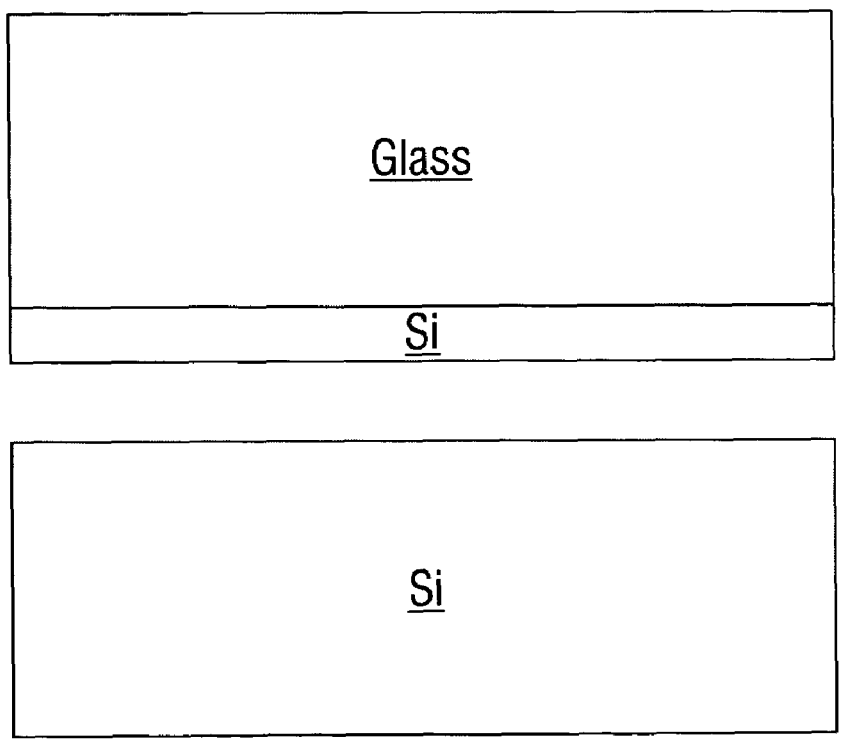

In FIG. 12 the wafer couples are immersed in an etch solution, which removes the SiGe or Ge at a high rate. After the sacrificial layer is completely etched, the wafer can be separated.

Figure 13:
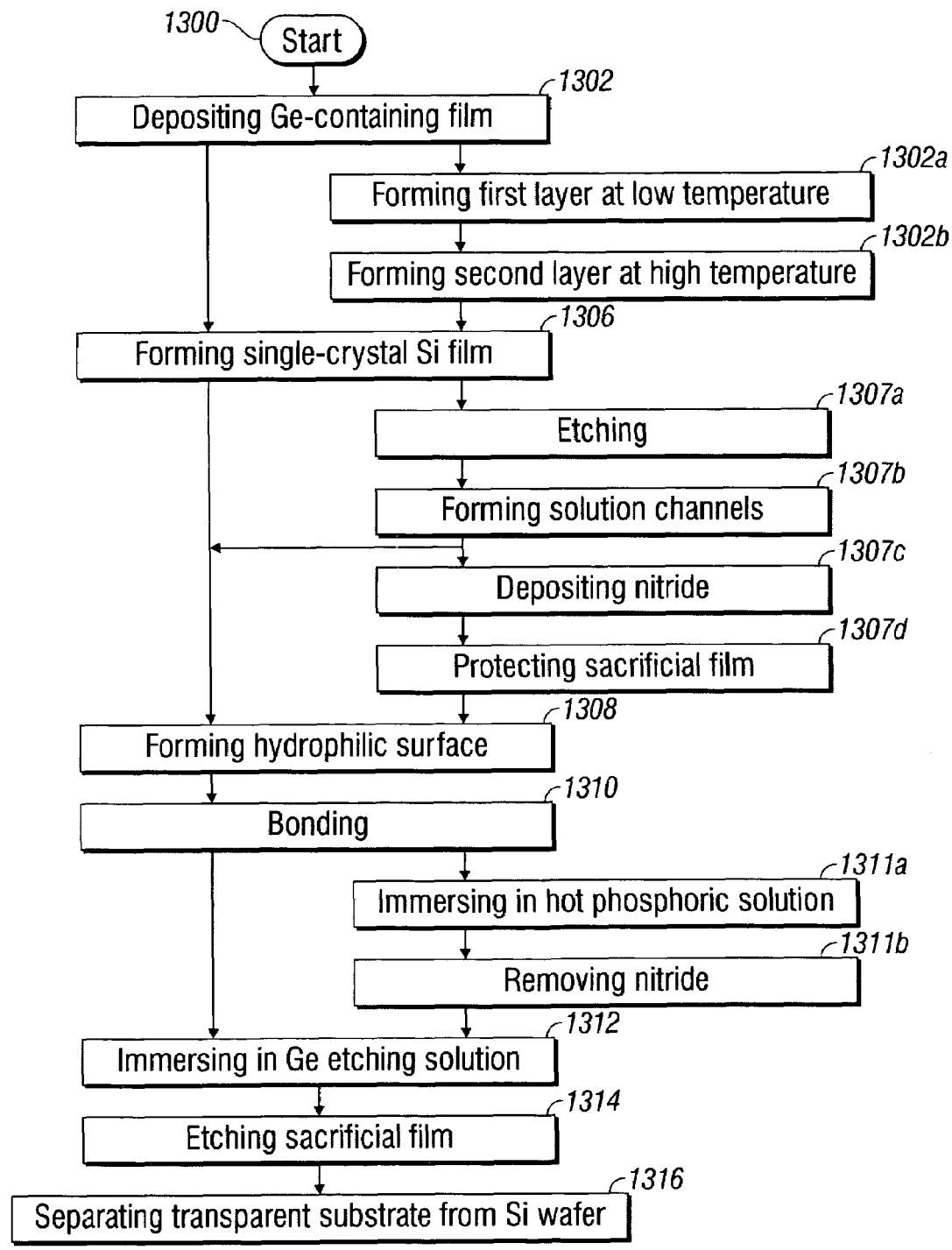
FIG. 13 is a flowchart illustrating a method for transferring a single-crystal Si film to a glass substrate.

FIG. 13 is a flowchart illustrating a method for transferring a single-crystal Si film to a glass substrate. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1300.

Step 1302 deposits a sacrificial Ge-containing film overlying a Si wafer. For example, the Ge-containing material may be SiGe or Ge, having a thickness in the range of 50 nanometers (nm) to 1 micrometer (μm). Step 1306 forms a single-crystal Si film overlying the sacrificial Ge-containing film. Step 1308 forms a hydrophilic film surface on the single-crystal Si. For example, the single-crystal Si film may be exposed to dilute SC-1. However, the method is not limited to the use of only SC-1 solution. Step 1310 bonds the hydrophilic Si film surface to a transparent substrate, forming a bonded substrate. The transparent substrate may be glass, quartz, or plastic. However, this method is applicable to other temperature-sensitive materials.

Step 1312 immerses the bonded substrate in a Ge etching solution. Step 1314 etches the sacrificial Ge-containing film. Step 1316 separates the transparent substrate from the Si wafer, forming a transparent substrate with an overlying single crystal Si film.

In one aspect, prior to forming the hydrophilic film surface, Step 1307a etches the single-crystal Si film and underlying sacrificial Ge-containing film. In response to the etching, Step 1307b forms solution channels between Si film regions having sidewalls. Then, immersing the bonded substrate in the Ge etching solution (Step 1312) includes inducing Ge etching solution into the solution channels.

In another aspect, subsequent to forming the solution channels, Step 1307c conformally deposits nitride using a PECVD process, and Step 1307d protects the sacrificial Ge-containing film from SC-1, or whatever other hydrophilic agent may be used, in response to forming the nitride layer. If nitride is used, Step 1311a immerses the bonded substrate in a hot phosphoric solution subsequent to forming the bonded substrate, and Step 1311b removes nitride from the Si film region sidewalls. In one aspect, Step 1311a pressure-induces phosphoric solution into the solution channels, for example, using a liquid pump. Subsequent to the hot phosphoric immersion, Step 1311c (not shown) pressure-induces water into the solution channels, and Step 1311d (not shown) removes residual phosphoric solution.

Likewise, immersing the bonded substrate in the Ge etching solution in Step 1312 may include pressure-inducing Ge etching solution into the solution channels. The Ge etching solution may be one of the following materials: persulfate, periodate, perbromate, perclorate, organic peroxide, inorganic peroxide, and oxidizing agents. However, the process is not necessarily limited to just these materials.

In one aspect, the sacrificial Ge-containing film formed in Step 1302 is a strained SiGe film layer. To form the strained SiGe film layer SiGe may be deposited with a CVD process that uses one of the following chemistries: $SiH_4/GeH_4/H_2$, $Si_2H_6/GeH_4/H_2$ and $Si_3H_8/GeH_4/H_2$ chemistries. Alternately, the sacrificial Ge-containing film may include a relaxed SiGe layer formed overlying the strained SiGe film layer.

In one aspect, forming the sacrificial Ge-containing film in Step 1302 includes forming a relaxed Ge film using a $GeH_4/H_2$ chemistry. In another aspect, forming the relaxed Ge layer includes substeps. Using a CVD process, Step 1302a deposits a first Ge layer, having a thickness in the range of 10 nanometers (nm) to 200 nm, at a deposition temperature in a range of about 250 to 300° C. Step 1302b deposits a second Ge layer, having a thickness in the range of 200 nm to 1 micrometer (µm), at a deposition temperature in a range of about 600 to 700° C. Details of this process are described in U.S. Pat. No. 7,037,856, issued on May 2, 2006, entitled, METHOD OF FABRICATING A LOW-DEFECT STRAINED EPITAXIAL GERMANIUM FILM ON SILICON, invented by Jer-shen Maa et al., which is incorporated herein by reference.

The single-crystal Si film of Step 1306 may be deposited with a CVD process using one of the following chemistries: $SiH_4$ (silane)/$H_2$, $Si_2H_6$ (disilane)/$H_2$, and $Si_3H_8$ (trisilane)/$H_2$ chemistries. In one aspect, Step 1306 deposits Si at a temperature in a range of about 400° C. to 700° C. In another aspect, the single-crystal Si film is formed by depositing Si using a PECVD process. The plasma-enhanced deposition enhances silane dissociation at lower temperature, by applying radio frequency (RF) power into the deposition chamber to initiate plasma.

A method has been provided for forming a single-crystal Si thin-film on a glass substrate. Some examples for specific chemistries and channel structures have been provided to illustrate the process, but the invention is not limited to merely these examples. Other variations and embodiments of the invention will occur to those skilled in the art.

We claim:

1. A method for transferring a single-crystal silicon (Si) film to a glass substrate, the method comprising:
    depositing a sacrificial germanium (Ge)-containing film overlying a Si wafer;
    forming a single-crystal Si film overlying the sacrificial Ge-containing film;
    etching the single-crystal Si film and underlying sacrificial Ge-containing film;
    in response to the etching, forming solution channels between single-crystal Si film regions having sidewalls;
    forming a hydrophilic film surface on the single-crystal Si;
    bonding the hydrophilic Si film surface to a transparent substrate, forming a bonded substrate;
    immersing the bonded substrate in a Ge etching solution, inducing Ge etching solution into the solution channels;
    etching the sacrificial Ge-containing film; and,
    separating the transparent substrate from the Si wafer, forming a transparent substrate with an overlying single crystal Si film.

2. The method of claim 1 wherein depositing the Ge-containing film overlying a Si wafer includes depositing a material selected from a group consisting of SiGe and Ge, to a thickness in a range of 50 nanometers (nm) to 1 micrometer (µm).

3. The method of claim 1 further comprising:
    subsequent to forming the solution channels, conformally depositing nitride using a plasma-enhanced chemical vapor deposition (PECVD) process; and,
    protecting the sacrificial Ge-containing film from SC-1 in response to forming the nitride layer.

4. The method of claim 3 further comprising:
    subsequent to forming the bonded substrate, immersing the bonded substrate in a hot phosphoric solution; and,
    removing nitride from the single-crystal Si film region sidewalls.

5. The method of claim 4 wherein immersing the bonded substrate in hot phosphoric solution includes pressure-inducing phosphoric solution into the solution channels.

6. The method of claim 5 further comprising:
    subsequent to the hot phosphoric immersion, pressure-inducing water into the solution channels; and,
    removing residual phosphoric solution.

7. The method of claim 1 wherein immersing the bonded substrate in the Ge etching solution includes pressure-inducing Ge etching solution into the solution channels.

8. The method of claim 1 wherein immersing the bonded substrate in a Ge etching solution includes using a Ge etching solution selected from a group consisting of persulfate, periodate, perbromate, perclorate, organic peroxide, inorganic peroxide, and oxidizing agents.

9. The method of claim 1 wherein bonding the hydrophilic Si film surface to the transparent substrate includes bonding to a substrate selected from a group consisting of glass, quartz, and plastic.

10. The method of claim 1 wherein forming the sacrificial Ge-containing film includes forming a strained SiGe film layer.

11. The method of claim 10 wherein forming the sacrificial Ge-containing film includes forming the strained SiGe layer, and forming a relaxed SiGe layer overlying the strained SiGe film layer.

12. The method of claim 10 wherein forming the strained SiGe film layer includes depositing the SiGe with a chemical vapor deposition (CVD) process using a chemistry selected from a group including $SiH_4/GeH_4/H_2$, $Si_2H_6/GeH_4/H_2$ and $Si_3H_8/GeH_4/H_2$ chemistries.

13. The method of claim 1 wherein forming the sacrificial Ge-containing film includes forming a relaxed Ge film using a $GeH_4/H_2$ chemistry.

14. The method of claim 13 wherein forming the relaxed Ge layer includes:

using a CVD process, depositing a first Ge layer, having a thickness in the range of 10 nanometers (nm) to 200 nm, at a deposition temperature in a range of about 250 to 300° C.; and, depositing a second Ge layer, having a thickness in the range of 200 nm to 1 micrometer (μm), at a deposition temperature in a range of about 600 to 700° C.

15. The method of claim 1 wherein forming the single-crystal Si film includes depositing Si using a CVD process with a chemistry selected from a group consisting of $SiH_4$ (silane)/$H_2$, $Si_2H_6$ (disilane)/$H_2$, and $Si_3H_8$ (trisilane)/$H_2$ chemistries.

16. The method of claim 1 wherein forming the single-crystal Si film includes depositing single-crystal Si at a temperature in a range of about 400° C. to 700° C.

17. The method of claim 1 wherein forming the single-crystal Si film includes depositing Si using a plasma-enhanced CVD (PECVD) process.

18. The method of claim 1 wherein forming the hydrophilic film surface on the single-crystal Si includes exposing the single-crystal Si film to dilute SC-1.

* * * * *